United States Patent [19]

Kimura

[11] Patent Number: 5,552,622
[45] Date of Patent: Sep. 3, 1996

[54] TUNNEL TRANSISTOR

[75] Inventor: Mitsuteru Kimura, Miyagi, Japan

[73] Assignees: Mitsuteru Kimura, Miyagi; Ricoh Seiki Company, Ltd., Tokyo, both of Japan

[21] Appl. No.: 493,980

[22] Filed: Jun. 23, 1995

Related U.S. Application Data

[63] Continuation of Ser. No. 89,811, Jul. 12, 1993, abandoned.

[30] Foreign Application Priority Data

Jul. 14, 1992 [JP] Japan .................. 4-186539

[51] Int. Cl.⁶ .................. H01L 27/01; H01L 27/12; H01L 29/76; H01L 29/94
[52] U.S. Cl. .................. 257/339; 257/17
[58] Field of Search .................. 257/339, 17, 321, 257/295

[56] References Cited

U.S. PATENT DOCUMENTS 4,644,386  2/1987  Nishizawa et al. .................. 257/339

5,177,568  1/1993  Hanma et al. .................. 257/295

FOREIGN PATENT DOCUMENTS 3-320565  6/1993  Japan .

*Primary Examiner*—Stephen Meier
*Attorney, Agent, or Firm*—Lowe, Price, LeBlanc & Becker

[57] ABSTRACT

The present invention is to provide a compact and high speed tunnel transistor having a high input impedance, yet consuming only a small quantity of power. In a tunnel transistor according to the present invention, a gate electrode is provided via an insulating thin film on a Schottky junction which is a junction between a semiconductor and a metallic layer, a $p-n^+$ junction between semiconductors, or an $n-p^+$ junction between semiconductors so that an accumulation layer having a high carrier density is formed bear the surface of a semiconductor by adjusting a gate voltage $V_g$ and thus a tunnel junction is formed between this accumulation layer and a metallic layer or a semiconductor having a high carrier density ($n^+$ or $p^+$) by adjusting the gate voltage $V_g$.

29 Claims, 5 Drawing Sheets

TUNNEL TRANSISTOR

This application is a continuation of application Ser. No. 08/089,811 filed Jul. 12, 1993 now abandoned.

FIELD OF THE INVENTION

The present invention relates to a compact and high speed tunnel transistor with a large impedance, which is used in such a device as a speed switching circuit.

BACKGROUND OF THE INVENTION

Conventional types of transistor include a bipolar transistor in which two p-n junctions each between semiconductors are combined, a junction-type field effect transistor (FET) in which a p-n junction is formed as a gate G between a source S and a drain D, a MIS (MOS) type FET in which an insulating thin film (oxide film) is formed on a surface of a semiconductor located between a source S and a drain D and a gate G is formed on it, and an electrostatic induction type of transistor (SIT) in which a gate length of the junction type FET described above is substantially reduced and for this reason channel potentials at a gate position can be controlled. In a bipolar transistor, a junction current flowing through the p-n junction is used, but generally a tunnel current is not used for its operations, nor is provided an insulating gate therein. Also when an electric current is caused to flow in FET or SIT, a channel for the current presents an identical conduction type, and a barrier causing a tunnel current to flow therethrough is not formed. The most important object in manufacturing switching transistors is to produce compact ones having a high processing speed, yet consuming only a small quantity of power. In the bipolar transistor, the base width essentially decides the processing speed, and if the base width is reduced excessively, a transistor effect is not provided due to the Early effect. In the FET, the gate length basically decides the processing speed, and the channel resistance as well as the gate capacity causes some problems to be solved. In case of SIT, the size can be reduced and a high processing speed is provided, but an advanced technology is required to bury the gate electrode. For the reasons as described above, development of a compact and high speed transistor having a large input impedance and consuming only a small quantity of power which can be used in a switching circuit has been desired. The present applicant already invented the "Schottky tunnel diode"(See the Japanese Patent Application No.320565/1991), but the diode has two terminals and is not equipped with a control function.

SUMMARY OF THE INVENTION

It is an object of the present invention to provide a compact and high speed transistor having a high input impedance, yet consuming only a small quantity of power by providing, as the third terminal for controlling a current, a gate electrode via an insulating thin film on a Schottky junction between a semiconductor and a metallic layer, a p-n$^+$ junction between semiconductors, or a n-p$^+$ junction between semiconductors so as to form a tunnel junction near the surface of the semiconductors.

Other objects and features of this invention will become understood from the following description with reference to the accompanying drawings.

DESCRIPTION OF THE PREFERRED EMBODIMENTS

Figure 1A:
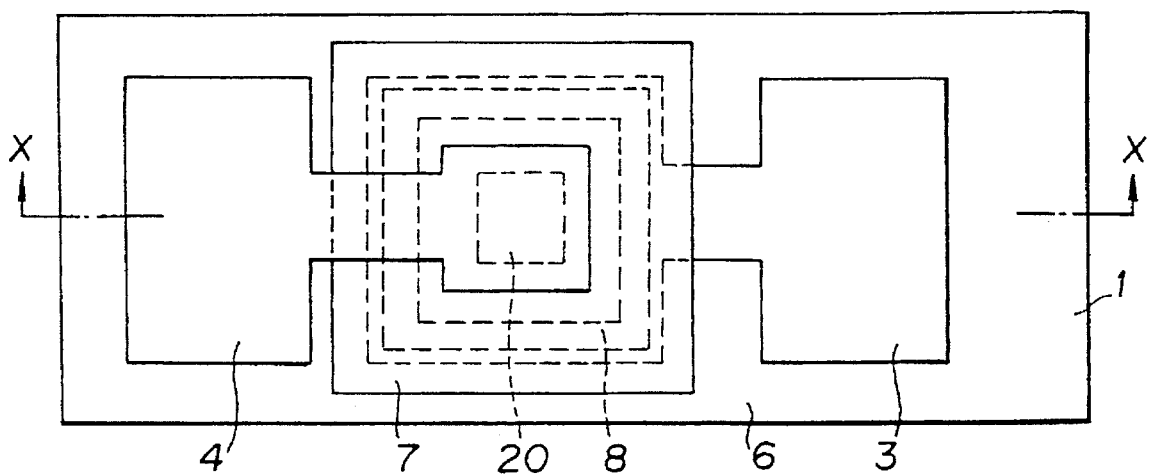
FIG. 1(A) is a flat view of a tunnel transistor according to one embodiment of the present invention in which a junction (schottky junction) between a n-type semiconductor(substrate) and a metallic layer (cathode) is used.

In the present invention, a gate electrode (insulating gate) is formed via an insulating thin film on a junction (Schottky junction) between a semiconductor and a metallic layer, a p-n$^+$ junction between semiconductors, or a n-p$^+$ junction between semiconductors, and an accumulation layer having a high carrier density is formed in the side of semiconductor in case of junction between a semiconductor and a metallic layer or in the side of a semiconductor having a lower carrier density (in the side of p in case of p-n$^+$ junction; and in the side of n in case of n-p$^+$ junction) and a tunnel junction is formed in each of the junctions between the accumulation layer and the metallic layer in the Schottky junction or the higher carrier density side in the n-p$^+$ and p-n$^+$ junction, for causing a tunnel current to flow therethrough, or the tunnel junction is caused to disappear by controlling a voltage Vg to the gate electrode, thus the tunnel current flowing the tunnel junction being freely controlled. A width of a tunnel junction when formed is very narrow, around 100 angstroms, so that an area of the gate electrode can substantially be reduced. For this reason a small gate capacity is provided and in addition a tunnel current can be used, so that the dependency on temperature is low and the processing speed is high. The essential factors required for realization of a high processing speed are the gate capacity and the time to form an accumulation layer having a high carrier density enough to form a tunnel junction. To realize the time required for formation of an accumulation layer satisfying the condition described above, it is recommended to set a density of a semiconductor in the lower density side to a relatively high level, for instance to $10^{17}$ (cm$^{-3}$). To form tunnel junction, it is necessary to set a density of an accumulation layer having a higher carrier density to a range from $10^{18}$ to $10^{19}$ (cm$^{-3}$), and for this reason it is required to set a density of semiconductor in the higher density side (n$^+$ side in the p-n$^+$ junction and p+ side in the n-p$^+$ junction) to a range from $10^{19}$ to $10^{20}$ (cm$^{-3}$).

Assuming a Schottky junction between an n-type semiconductor and a metallic layer as a junction between a semiconductor and a metallic layer (Schottky junction), if a gate electrode is formed via an insulating thin film on the junction, when a voltage is loaded in the reverse direction to the Schottky junction in a state where a gate voltage is not loaded to the gate electrode (Vg=0), only a Schottky junction current to an extent of an extremely minute quantity of reverse saturation current flows there provided that a positive electric charge exists little in the insulating thin film. However, when a positive voltage (Vg>0) is loaded to a gate electrode of the n-type semiconductor, an n$^+$ accumulation layer is formed in a surface of the n-type semiconductor, and if a carrier density of this n$^+$ accumulation layer is raised to a range from $10^{18}$ to $10^{19}$ (cm$^{-3}$), a tunnel junction is formed between the n$^+$ accumulation layer and a metallic layer in the Schottky junction. For this reason, when a reverse voltage is loaded to the Schottky junction, a tunnel current flows in the tunnel junction formed there. A density of the n$^+$ accumulation layer depends on the gate voltage Vg, so the tunnel current can be controlled by controlling the gate voltage Vg. It is needless to say that a tunnel junction is not formed when an n$^+$ accumulation layer is not formed in the surface of the n-type semiconductor, and the tunnel junction can be caused to disappear by setting the gate voltage Vg to 0. This is true also in a Schottky junction which is a junction between a p-type semiconductor and a metallic plate, and the difference from a junction between an n-type semiconductor and a metallic layer is only that a sign of the loaded voltage is contrary.

The case where a gate electrode (insulating gate) is formed via an insulating thin film on a p-n$^+$ junction between semiconductors or an n-p$^+$ junction between semiconductors can be regarded as the same as a Schottky junction, assuming a semiconductor in the higher density side (n$^+$ side in a p-n$^+$ junction, and p$^+$ side in an n$^+$-p junction) as a metallic layer in the Schottky junction. However, in case of Schottky junction, the tunnel barrier is a Schottky barrier, while in case of p-n$^+$ junction or n-p$^+$ junction the tunnel barrier is a band gap Eg in the semiconductor. Generally a Schottky barrier is smaller than a band gap Eg in a semiconductor, so that a large tunnel current can be controlled with a small gate voltage Vg better in a transistor making use of a Schottky junction than in that making use of a junction between semiconductors. Also even if a large tunnel current does not flow under a given gate voltage Vg, the tunnel junction width can be reduced by making larger the reverse voltage loaded to each junction (a voltage between the anode and the cathode ) so that a large tunnel current can be generated.

A thickness of a tunnel junction in the transistor as described above is extremely small, around 100 angstroms, so also a dimension of the gate electrode may be essentially in this size range. This tunnel transistor is based on the construction in which a gate electrode is provided on a diode, which means that the transistor can substantially be minimized and is suited for production of VLSIs. In order to form a number of tunnel transistors on the same substrate, each tunnel transistor should preferably be electrically separated and insulated to each other. One way of achieving the object is to provide many island regions having a different conduction type from that of the substrate (for instance, n-type island regions if the substrate is of p-type) and form a tunnel transistor in each of the island regions. The ways of forming the island regions include a method in which impurity such as phosphorus (P) having an n-type of conduction type is formed on, for instance, a p-type Si substrate by way of thermal diffusion or ion-implantation from the surface of the substrate to form an n-type island region; a method in which an n-type epitaxial growth layer or a diffusion layer is formed homogeneously on the surface of a p-type substrate and then p-type impurity is thermally diffused or ion-implanted at a high density so as for the impurity to reach the p-type substrate and leave portions of the n-type epitaxial growth layer or the diffusion layer like islands; and a method in which narrow and deep trenches or an oxidized film extending from the surface of the p-type epitaxial growth layer or the diffusion layer and reaching the p-type substrate through these layers are formed so that portions of the n-type epitaxial layer or the diffusion layer are left like islands. Generally surface states exist on an interface between a semiconductor and an insulating thin film layer formed on it. In a tunnel transistor, due to a surface state formed on an interface between an insulating thin film (gate oxide film) just below a gate electrode and a semiconductor (a semiconductor having a low carrier density in which an accumulation layer is formed in cases of p-n$^+$ junction and n-p$^+$ junction), sometimes tunnel carriers may be trapped on the surface state, which may in turn cause a flow of tunnel current through this surface state. For this reason, even though the tunnel current itself has a ultra high velocity by its nature, a high speed responsibility can hardly be obtained in the tunnel transistor due to charge. to or discharge from the surface state. To solve this problem, tunnel carriers as a tunnel current should flow without passing through the surface state. To achieve the object, a foresaid accumulation layer (having the thickness of, for instance, 50 angstroms) of semiconductor containing impurities at a high density having a different conduction type from that of the semiconductor is formed near the interface with an insulating thin film just below a gate electrode on a semiconductor in which an accumulation layer is formed and a potential barrier against the tunnel carriers are formed so that movement of carriers in the accumulation layer to and off from the surface state is suppressed as much as possible when a voltage is loaded to the gate electrode to form a tunnel junction and an accumulation layer is formed. With this configuration, tunnel carriers flowing in a tunnel junction flow as a tunnel current essentially without passing the surface state, and a transistor having a high responsibility is obtained.

[Embodiment 1]

Figure 1B:
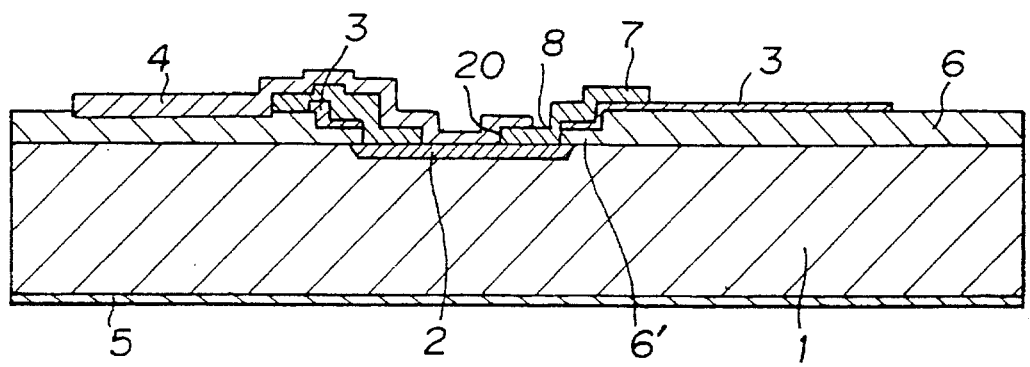
FIG. 1(B) is a transverse sectional view of the tunnel transistor viewed from the line X—X in the flat view (FIG. 1(A)) when the gate voltage Vg is 0 V.
Figure 1C:
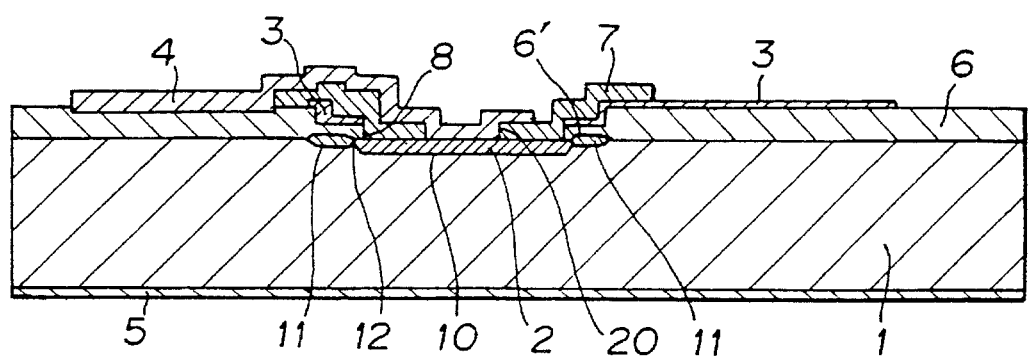
FIG. 1(C) is a transverse sectional view of the same taken along the line X—X in FIG. 1(A) when a positive gate voltage Vg (for instance Vg=10 V) is loaded so that the electric potential at the gate is positive against an n-type substrate (anode)

FIG. 1(A) is a flat view illustrating a transistor according to one embodiment of the present invention in which a junction between a semiconductor according to the present invention and a metallic layer (Schottky junction) is used, FIG. 1(B) is a transverse sectional view of the same viewed from the line X—X in the flat view above (FIG. 1(A)) when the gate voltage Vg is 0 V, and FIG. 1(C) is a sectional view of the same taken along the line X—X above when a positive gate voltage Vg (for instance, Vg=10 V) is loaded so that the electric potential at the gate is positive against the n-type substrate (anode) to form the tunnel junction. The transistor in this embodiment is formed, for instance, as described below. A thick thermally oxidized $SiO_2$ film 6 with the thickness of around 0.5 μm is formed on the surface of an n-type Si substrate 1 containing impurities at a density of $1 \times 10^{17}$ cm$^{-3}$, a 600 μm×600 μm window is arranged in the film by means of photolithography, and furthermore a thin thermally oxidized $SiO_2$ film 6' with the thickness of around 0.08 μm is formed on it as an insulating thin film for a gate. Then sputtering is performed by depositing Ti and Au in this order to form a double layers, a 500 μm×500 μm window 8 is arranged at the center to form a Schottky diode, and patterning is performed in the peripheral area to form a gate electrode 3 by means of photolithography. Then the thin thermally oxidized $SiO_2$ film 6' is removed by etching through the 500 μm×500 μm window 8 to form a Schottky junction, making use of the Ti and Au thin films as an etching mask. Then, sputtering is performed with Mo and furthermore heat treatment is carried out there to form molybdenum silicide ($MoSi_2$) 2 in the 500 μm×500 μm window 8 in which the Si layer is exposed, and a Schottky junction 10 is formed between this molybdenum silicide 2 and the n-type Si substrate 1. Then an excessive Mo film is removed by etching so that the gate electrode 3 comprising a Ti layer and an Au layer and the molybdenum silicide 2 are electrically separated and insulated to each other. The external periphery of the Schottky junction 10 formed as described above and the internal periphery of the gate electrode 3 are self-aligned, which is advantageous. In a process to form the molybdenum silicide 2, the molybdenum silicide 2 area slightly creeps into under the thin thermally oxidized $SiO_2$ film 6' which is an insulating thin film for the gate, so that the external periphery of the Schottky junction 10 is located under the gate electrode 3. For this reason problems associated with the pressure resistance of the thin thermally oxidized film $SiO_2$ (insulating thin film) can easily be solved, and an n$^+$ accumulation layer 11 can be formed effectively. Then an insulating thin film 7 comprising a silicon nitride thin film is formed as an insulating thin film by means of plasma CVD, patterning is carried out thereon, furthermore a contact window 20 to obtain ohm contact from the molybdenum silicide 2 is formed in the insulating thin film 7 comprising a silicon nitride thin film, aluminum is deposited on it by means of vacuum evaporation, and patterning is carried out to form a cathode electrode 4. In addition, to use the n-type Si substrate 1 as an anode, Au is deposited on the rear surface of the n-type Si substrate (together with Sb by a few weight percent of Au) by means of vacuum evaporation and an anode electrode 5 is formed there by means of sintering.

Figure 2:
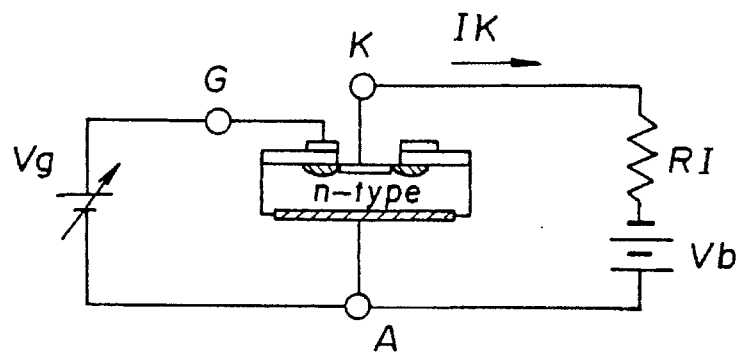
FIG. 2 a drawing illustrating an operation circuit of a transistor using a Schottky junction according to the present invention.
Figure 3:
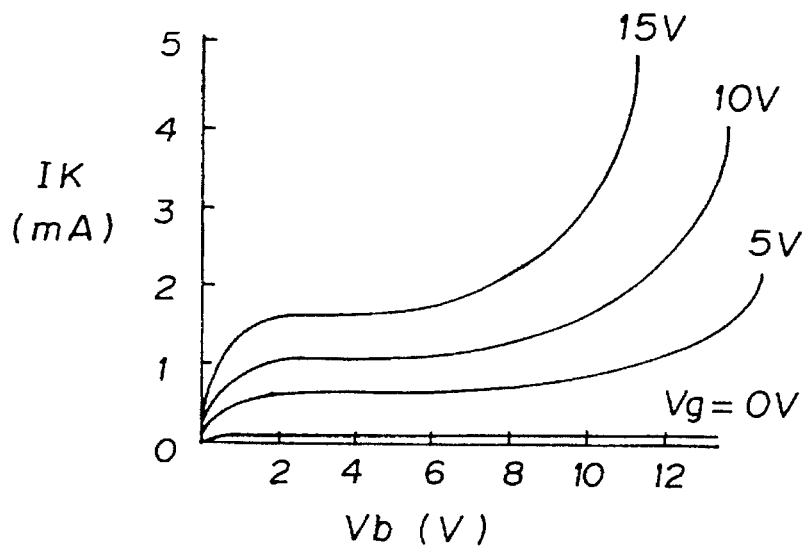
FIG. 3 is a drawing illustrating a relation between a power voltage Vb and a cathode current Ik plotted by using as a parameter a gate voltage Vg in a tunnel transistor in which a Schottky junction according to the present invention is used.

In the tunnel transistor formed as described above, if a gate voltage Vg is loaded to the gate terminal G so that the electric potential at the terminal will become positive against the anode terminal, and a tunnel junction is formed. A while a power voltage Vb is loaded through the load resistance R1 to the cathode terminal K as well as to the anode terminal A so that the Schottky junction is biased in the reverse direction as shown in FIG. 2, the n$^+$ accumulation layer 11 is formed on the surface of the n-type Si substrate 1 under the thin thermally oxidized $SiO_2$ film (insulating thin film) 6' as shown in FIG. 1(C), so that the tunnel junction 12 is formed between the n$^+$ accumulation layer 11 and the molybdenum silicide 2, and a cathode current Ik mainly comprising a tunnel current flows there. FIG. 3 is a schematic diagram illustrating a relation between the power voltage Vb and the cathode current Ik plotted with a gate voltage Vg as a parameter.

The description above relates to one embodiment of the transistor in which a junction between a semiconductor and a metallic layer (Schottky junction) is used, but in case of a transistor in which a p-n$^+$ junction between semiconductors or an n-p$^+$ junction between semiconductors is used, the junction can be regarded as a Schottky junction, assuming a semiconductor in the higher carrier density side (n$^+$ side in a p-n$^+$ junction, and p$^+$ side in an n-p$^+$ junction) as a metallic layer in the Schottky junction, so the construction in which the molybdenum silicide 2 in the Schottky junction in the embodiment of the transistor shown in FIG. 1 with the Schottky junction according to the present invention used therein is replaced with a semiconductor in the higher carrier density side is allowable. In order to form an n$^+$- or a p$^{30}$-semiconductor in the higher carrier density side, for instance, a high impurity density region may be formed by implanting phosphorus (P) or boron (B) ions through the 500 μm×500 μm window 8, making use the Au/Ti double layer as a mask. For instance, in case of a transistor in which an n-p$^+$ junction is used, a tunnel transistor can be formed by using an n-type Si substrate 1 according to the same procedure as in the embodiment of tunnel transistor described above in which a junction between a semiconductor and a metallic layer (Schottky junction) is used. The difference consists in which of ion implantation of high density boron (B) or impurity diffusion is employed in place for forming molybdenum silicide 2. When a voltage is loaded to each terminal likely in a tunnel transistor in which a junction (Schottky junction) between a semiconductor and a metallic layer is used (See FIG. 2), an n$^+$ accumulation layer 11 is formed on the surface of the n-type Si substrate 1 under the thin thermally oxidized $SiO_2$ film (insulating thin film) 6' as shown in FIG. 1(C), so that a tunnel junction 12 with the p$^+$-semiconductor is formed and a cathode current Ik mainly comprising a tunnel current component flows there.

[Embodiment 2]

Figure 4:
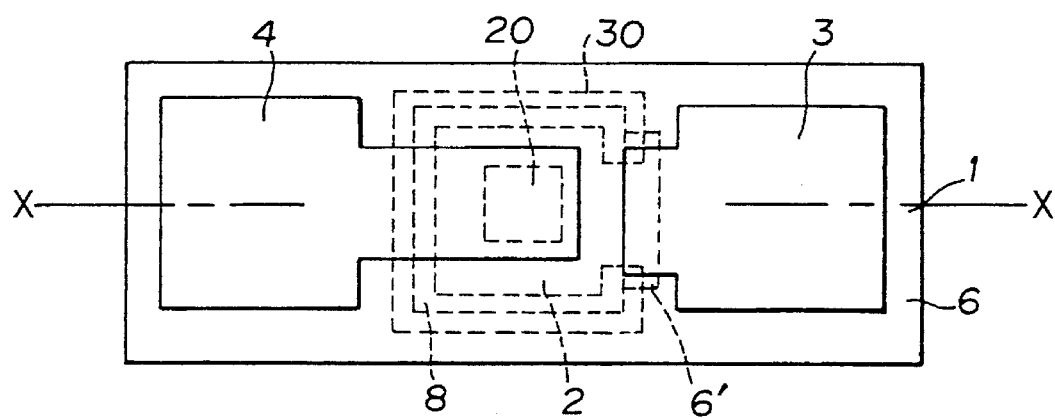
FIG. 4 is a flat view illustrating another embodiment of the tunnel transistor in which a Schottky junction according to the present invention is used.

FIG. 4 is a flat view of another embodiment of a tunnel transistor according to the present invention in which a semiconductor and a metallic layer (Schottky junction) is used. This embodiment is basically the same as that described above in which a Schottky junction is used, but is different from the latter in that the gate electrode does not surround the Schottky junction 10 completely but exists only along a portion of the periphery thereof. Because of this construction, sometimes a leakage current is generated in a portion of the external periphery of the Schottky junction 10 where the gate electrode 3 does not exists, so a guard ring layer having a different conduction type form that of the substrate 1 (actually a portion of a guard ring) is buried there. For instance, when an n-type Si substrate 1 is used, a p-type guard ring 30 is buried there.

[Embodiment 3]

Figure 5A:
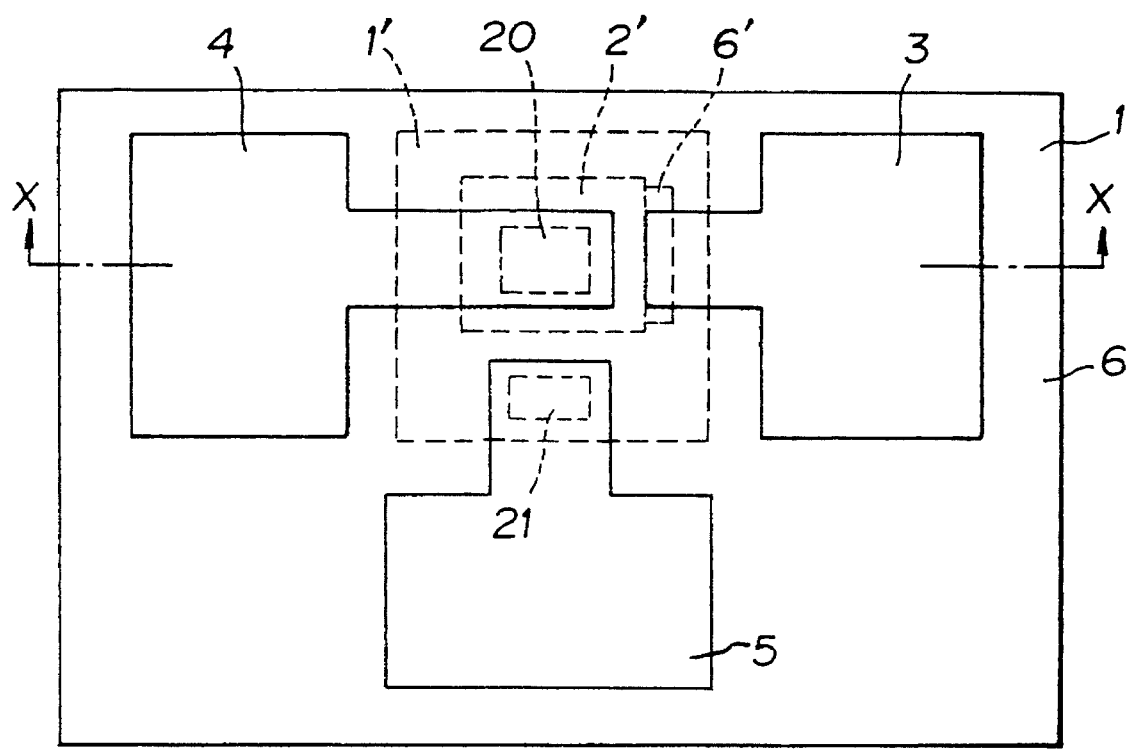
FIG. 5(A) is a flat view illustrating another embodiment of a transistor in which an n-p$^+$ junction between semiconductors according to the present invention is used.
Figure 5B:
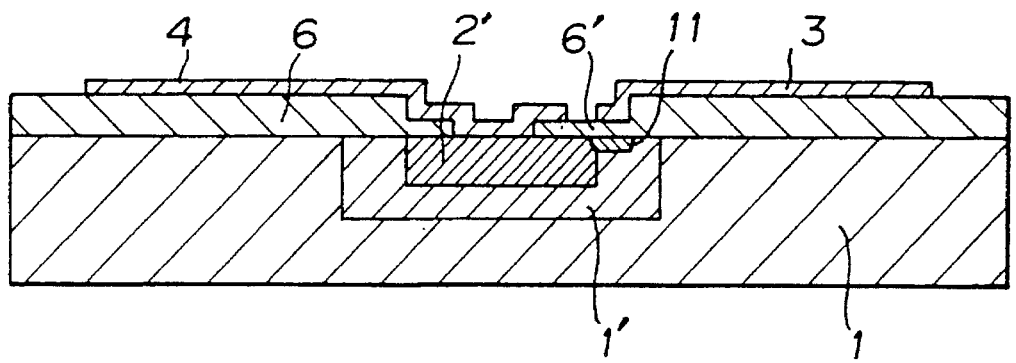
FIG. 5(B) is a transverse sectional view illustrating the same viewed from the line X—X in the flat view above (FIG. 5(A)) in a case where a positive gate voltage Vg (for instance, Vg=10 V) is loaded so that the electric potential at the gate is positive against the n-type diffusion layer (anode) 1'.

FIG. 5(A) is a flat view of the other embodiment of a transistor in which an n-p$^+$ junction between semiconductors according to the present invention is used, FIG. 5(B) is a transverse sectional view of the same viewed from the line X—X in the flat view above (FIG. 5(A)) when a gate voltage Vg is loaded so that the electric potential at the gate will be positive against the n-type diffusion layer (anode) 1', and the accumulation layer is formed under the gate electrode to make tunnel junction at the Schottky junction. This embodiment is the same as the case described above in which an n-p$^+$ junction is used (Embodiment 1), excluding the following differences. 1) A p-type Si is used as a substrate 1. 2) An n-type diffusion layer 1' for insulation between transistor elements is formed so that several transistor elements can be formed on the same substrate 1. This corresponds to the n-type substrate 1 (shown, for instance, in FIG. 1) in the aforesaid embodiment (Embodiment 1). 3) A p$^+$ diffusion layer 2' is formed on an n-type diffusion layer 1'. 4) As shown in Embodiment 2, the gate electrode 3 does not surround the n-p$^+$ junction completely and exists only along a portion of the periphery thereof. 5) An anode electrode 5 is formed on the surface of the substrate 1 to realize a planer type of semiconductor. Then a contact window 21 is formed as an ohm electrode on the SiO$_2$ film formed on the n-type diffusion layer 1' which functions as an anode. The electric connection and the relation between the cathode current Ik and the power voltage Vb in the transistor according to this embodiment are generally the same as those in Embodiment 1. It is needless to say that also a transistor with a p-n$^+$ junction between semiconductors used therein can be regarded as the same if n and p are reversed. It should be noted that, in the above description concerning the embodiments of the present invention, the sections having the same functions or the same effects are indicated by the same signs.

[Embodiment 4]

Figure 6:
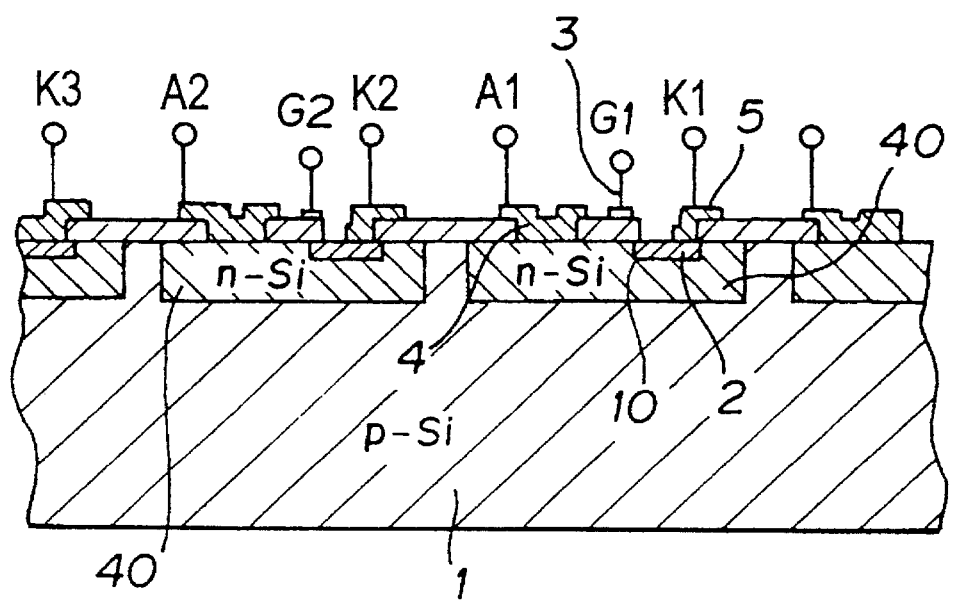
FIG. 6 is a sectional view of an embodiment of a transistor according to the present invention wherein a plurality of island regions having a different conduction type from that of the substrate are formed, a tunnel transistor is formed in each of the island regions respectively, and elements are electrically separated by making use of a p-n junction formed between the substrate and each island regions having a different conduction type from that of the substrate for the purpose to form a plurality of tunnel transistors on the same substrate; namely an embodiment of the present invention wherein a junction between a semiconductor and a metallic layer is used as a junction to form a tunnel junction therein.

FIG. 6 is a sectional view of an embodiment of a tunnel transistor according to the present invention wherein a plurality of island regions having a different conduction type from that of a substrate are formed on the same substrate, a tunnel transistor is formed in each of the island regions respectively, and elements are electrically separated by making use of a p-n junction formed between the substrate and the island region each having a different conduction type from that of the substrate for the purpose to form a plurality of tunnel transistors on the same substrate, and this embodiment shows a case where a junction between a semiconductor and a metallic layer is used as a junction which changes into a tunnel junction. In this example, n-type island regions 40 (each having the size of, for instance, 50 μm×50 μm) are formed by ion-implanting phosphorus to the depth of around 1.5 μm of a p-type substrate (containing boron impurities at the density of around $10^{14}$ cm$^3$, (III) face) making use of a silicon nitride film not shown herein as a mask, and a tunnel transistor is formed in each of the n-type island regions like in the embodiment described above. Herein, an anode A, a cathode K, and a gate G of each different tunnel transistor are differentiated by using suffix such as A1 or A2. It should be noted that, although A,K, and G are located on a straight line in the drawing, practically it is not necessary to locate them on a straight line and may be located freely in a two-dimensional or a three-dimensional surface. Also in FIG.6, one tunnel transistor element is arranged in one n-type island region 40, but a plurality of tunnel transistor elements may be formed in one n-type island region provided that the elements share a cathode K. Furthermore FIG. 6 shows a case where a junction between a semiconductor (n-type) and a metallic layer is used to form a tunnel junction, but it is obvious that the same effect can be obtained by using a p-n$^+$ junction or an n-p$^+$ junction.

[Embodiment 5]

Figure 7:
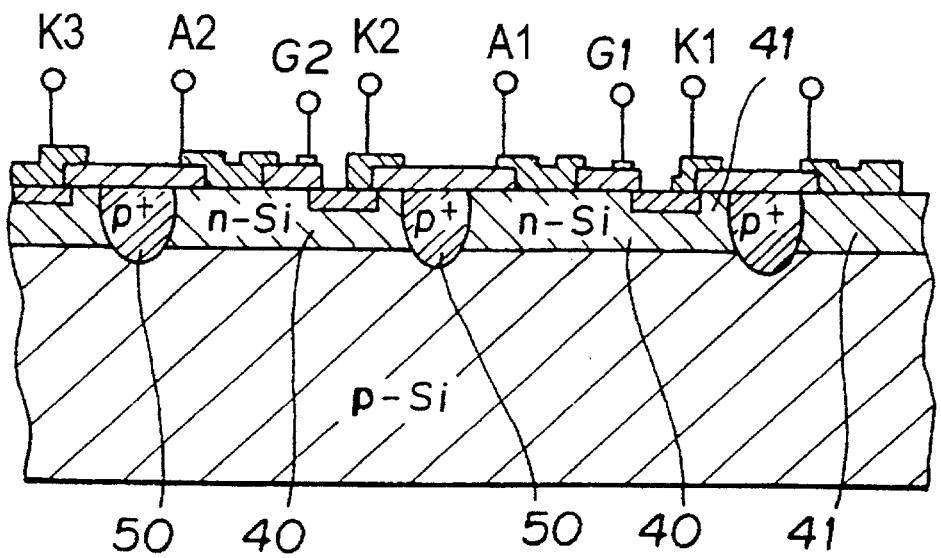
FIG. 7 is a sectional view of an embodiment of a tunnel transistor according to the present invention, wherein, when n-type island regions are formed, the n-type island regions are electrically separated by means of ion-implantation or thermal diffusion of impurities having the same conduction type as that of the p-type substrate or any form of combination thereof like in Embodiment 4.

FIG. 7 is a sectional view of an embodiment of the present invention wherein, when n-type island regions 40 are formed, the n-type island regions and the p-type substrate are electrically separated by means of ion-implantation or thermal diffusion of impurities having the same conduction type as that of the p-type substrate or any form of combination thereof. This embodiment can be formed, for instance, by at first homogeneously forming an n-type epitaxial layer 41 (containing phosphorus impurities at the density of around $10^{15}$ cm$^{-3}$ and having the thickness of 1.5 μm) and enclosing each portion of the epitaxial layer 41 with a p$^+$ region 50 reaching the p-type substrate so that n-type island regions will remain, for instance, in a cross-cut form. Then, a tunnel transistor element can be formed in each of the n-type island regions 40 according to the method described above.

Also the n-type island regions 40 can electrically be separated by forming thin trenches or an oxide film each reaching the p-type substrate in place of forming p$^+$ regions 50, although this case is not shown herein.

[Embodiment 6]

Figure 8:
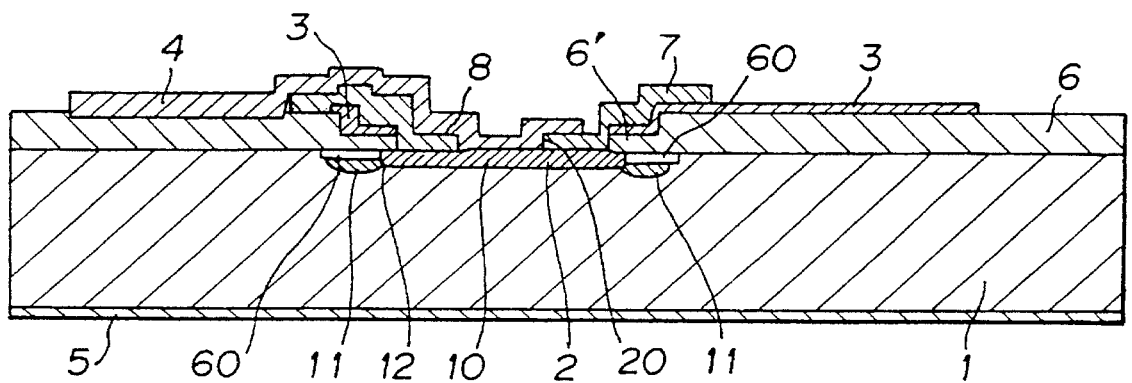
FIG. 8 is a sectional view of an embodiment of the present invention, namely an improved type of a tunnel transistor in Embodiment 1 having a tunnel junction between an n-type semiconductor according to the present invention and a metallic layer, wherein an impurity doped layer comprising a p-type thin film having a different conduction type from that of the n-type semiconductor is formed near the semiconductor surface just below the gate electrode.
Figure 9:
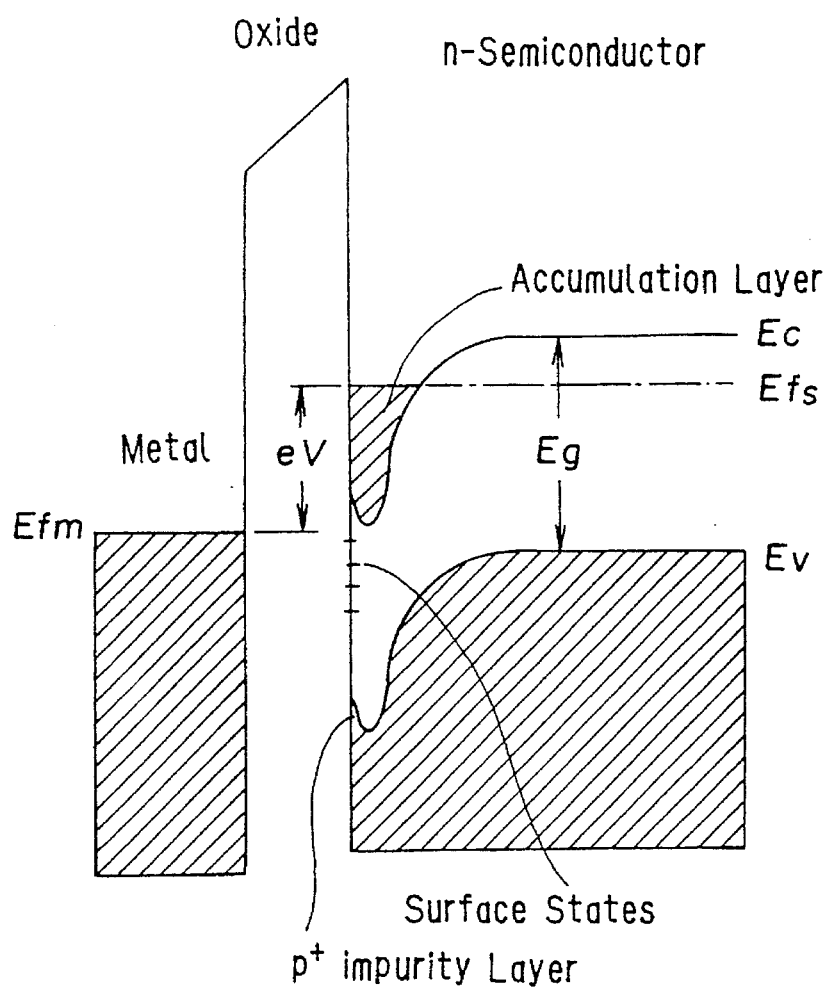
FIG. 9 is an energy band diagram for a MOS structure in a region just below a gate electrode in a tunnel transistor according to the present invention illustrating a state when a gate voltage Vg equal to V (Vg=V) is loaded to the gate electrode.

FIG.8 is a sectional view of an embodiment of the present invention, namely an improved type of tunnel transistor in Embodiment 1 with a tunnel junction between an n-type semiconductor according to the present invention and a metallic layer, wherein an impurity doped layer 60 comprising a p-type thin film having a different conduction type from that of the n-type semiconductor is formed near the semiconductor surface just below the gate electrode to reduce influences by a surface state formed on an interface between the insulating thin film 6' and the n-type semiconductor (herein, a substrate of semiconductor 1. The impurity doped layer 60 can be formed, for instance, by ion-implanting boron to the depth of around 50 angstroms and in addition at a high density (around $10^{18}$ cm$^{-3}$). With this configuration, as shown in FIG. 9 which is an energy band diagram in the MOS structure just below the gate electrode 3, because of the existence of the impurity doped layer 60, the band structure near the MOS surface of the semiconductor bends to become a potential barrier against electrons, so that a position of local minimum of energy band of electrons in the n$^+$ accumulation layer 11 goes away from the MOS surface. As a tunnel current becomes maximum at a position of local minimum of energy band in the n$^+$ accumulation layer 11, so that a component of tunnel current not passing through the surface state increases and thus a tunnel transistor having a high speed responsibility specific to a tunnel current can be obtained.

In this embodiment is used a tunnel junction between an n-type semiconductor and a metallic layer, but also the same effect can be obtained by using a p-n$^+$ junction or a n-p$^+$ junction.

All the embodiments described above assume a case where tunnel transistor elements are arrayed on a flat surface, but also so-called the three-dimensional IC in which n-type or p-type polysilicon thin films with an insulating thin film made of such a material as $SiO_2$ provided between each film are formed into a multi-layered form and tunnel transistor elements are arrayed on or linked to each polysilicon thin film layer.

As described above, in the tunnel transistor according to the present invention, a gate electrode is provided via an insulating thin film on a Schottky junction which is a junction between a semiconductor and a metallic plate, a $p$-$n^+$ junction between semiconductors or an $n$-$p^+$ junction between semiconductors to control a current so that a tunnel junction can be formed near the surface of a semiconductor by adjusting a voltage loaded to a gate for the purpose to control the tunnel current, and the tunnel transistor is useful for production of a compact and high speed switching transistor having a large input impedance as well as for power saving and realization of high efficiency. Also an VLSI device can be formed by forming a number of ultra compact tunnel transistor elements with a common anode on the same substrate.

Although the invention has been described with respect to specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A tunnel transistor with a gate electrode provided through an insulating thin film on a tunnel junction between a semiconductor and a metallic layer, wherein the gate electrode is so formed that the gate electrode does not reach an ohmic electrode formed in the semiconductor, an accumulation layer having a high carrier density is formed in a side of the semiconductor to enable of the tunnel junction by adjusting an applied voltage to the gate electrode, a tunnel current passing between the metallic layer and the ohmic electrode formed in the semiconductor via the tunnel junction being controlled by the applied voltage.

2. A tunnel transistor according to claim 1, wherein a plurality of island regions having a different conductivity type from that of the semiconductor is formed on the semiconductor substrate, the plurality of island regions and the semiconductor substrate are insulated from each other, and the tunnel transistor is formed on each of the plurality of island regions.

3. A tunnel transistor according to claim 1, wherein an impurity doped layer having a different conductivity type from that of the semiconductor is arranged near an interface with the insulating thin film just below the gate electrode in the semiconductor in which the accumulation layer should be formed so that movement of tunnel carriers is suppressed when the tunnel junction is formed.

4. A tunnel transistor with a gate electrode provided via an insulating thin film on a $p$-$n^+$ junction of a semiconductor, wherein an accumulation layer having a high carrier density is formed in a side of the semiconductor only when a voltage is applied to the gate electrode so that a tunnel junction is formed in the $p$-$n^+$ junction and a tunnel current flowing from the accumulation layer through the tunnel junction is controlled by adjusting the voltage loaded to the gate electrode and said tunnel current is primarily due to tunnelling effect.

5. A tunnel transistor according to claim 4, wherein a plurality of island regions having a different conductivity type from that of the semiconductor is formed on the semiconductor substrate, the plurality of island region and the semiconductor substrate are insulated from each other, and the tunnel transistor is formed on each of the plurality of island regions.

6. A tunnel transistor according to claim 4, wherein an impurity doped layer having a different conductivity type from that of the semiconductor is arranged near an interface with the insulating thin film just below the gate electrode in the semiconductor in which the accumulation layer should be formed so that movement of tunnel carriers is suppressed when the tunnel junction is formed.

7. A tunnel transistor with a gate electrode provided via an insulating thin film on a $n$-$p^+$ junction of a semiconductor, wherein an accumulation layer having a high carrier density is formed in a side of the semiconductor only when a voltage is applied to the gate voltage so that a tunnel junction is formed in the $n$-$p^+$ junction and a tunnel current flowing from the accumulation layer through the tunnel junction is controlled by adjusting the voltage loaded to the gate electrode and said tunnel current is primarily due to tunnelling effect.

8. A tunnel transistor according to claim 7, wherein a plurality of island regions having a different conductivity type from that of the semiconductor are formed on the semiconductor substrate, the plurality of island regions and the semiconductor substrate are insulated from each other, and the tunnel transistor is formed on each of the island regions.

9. A tunnel transistor according to claim 7, wherein an impurity doped layer having a different conductivity type from that of the semiconductor is arranged near an interface with the insulating thin film just below the gate electrode in the semiconductor in which the accumulation layer should be formed so that movement of tunnel carriers is suppressed when the tunnel junction is formed.

10. A tunnel transistor with a gate electrode provided through an insulating film on a tunnel junction between a metallic layer and a semiconductor, wherein an accumulation layer having a high carrier density is formed in a side of the semiconductor to enable a formation of the tunnel junction only when a voltage is applied to the gate electrode, a tunnel current passing between the metallic layer and the ohmic electrode formed in the semiconductor via the tunnel junction being controlled by the applied voltage, and the gate electrode exists not along the entire periphery but only along a portion of the periphery of the tunnel junction and a guard ring layer having a different conductivity type from that of the semiconductor is buried along the remaining portion of the periphery thereof.

11. A tunnel transistor according to claim 10, wherein the guard ring is a p-type when the substrate is an n-type.

12. A tunnel transistor according to claim 10, wherein a plurality of island regions having a different conductivity type from that of the semiconductor is formed on the semiconductor substrate, the plurality of island regions and the semiconductor substrate are insulated from each other, and the tunnel transistor is formed on each of the plurality of island regions.

13. A tunnel transistor according to claim 10, wherein an impurity doped layer having a different conductivity type from that of the semiconductor is arranged near an interface with the insulating thin film just below the gate electrode in the semiconductor in which the accumulation layer should be formed so that movement of tunnel carriers is suppressed when a tunnel junction is formed.

14. A tunnel transistor with a gate electrode provided via an insulating thin film on an $n$-$p^+$ junction between semiconductors, wherein the $n$-$p^+$ junction is formed by providing an n-type layer formed for insulation between a p-type silicon substrate and elements in the p-type silicon substrate and also providing a p⁺ layer near a surface of the n-type layer.

15. A tunnel transistor according to claim 14, wherein a plurality of island regions having a different conductivity type from that of the semiconductor is formed on the p-type silicon substrate, the plurality of island regions and the p-type silicon substrate are insulated from each other, and the tunnel transistor is formed on each of the plurality of island regions.

16. A tunnel transistor according to claim 14, wherein an impurity doped layer having a different conductivity type from that of the p-type silicon substrate is arranged near an interface with the insulating thin film just below the gate electrode in the p-type silicon substrate in which an accumulation layer should be formed so that movement of tunnel carriers is suppressed when a tunnel junction is formed.

17. A tunnel transistor comprising:

a semiconductor substrate of a first conductivity type having oppositely disposed surfaces and an ohmic electrode formed on one of the surfaces;

a heavily doped region of a predetermined conductivity type formed in said semiconductor substrate near other surface of the oppositely disposed surfaces;

a gate formed through an insulating layer on a tunnel junction between the semiconductor substrate and said heavily doped region, said gate electrode not overlapping said ohmic electrode; and an accumulation layer formed in said semiconductor substrate and beneath said gate in response to a voltage applied to said gate such that the tunnel junction is formed between said accumulation layer and said heavily doped region for a tunnel current to flow therebetween, the tunnel current being controllable in response to the predetermined voltage applied to said gate such that said tunnel current is primarily due to tunnelling effect.

18. The tunnel transistor of claim 17, wherein said gate is formed all around the end of said heavily doped region, and said accumulation layer is formed around the end of said heavily doped region.

19. The tunnel transistor of claim 17, wherein first conductivity of said substrate is one of n type and p type when said predetermined conductivity type of said heavily doped region is one of p type and n type, respectively.

20. The tunnel transistor of claim 17, wherein said first conductivity type of said substrate is n type, and said heavily doped region is a silicide region forming a Schottky junction with said substrate.

21. The tunnel transistor of claim 17, wherein a guard region having opposite conductivity from said substrate is formed around the end of said heavily doped region, except at the end underneath said gate.

22. The tunnel transistor of claim 17 further comprises a first electrode connected to said heavily doped region, and a second electrode formed on the opposite surface of said substrate from said heavily doped region.

23. The tunnel transistor of claim 17, wherein a semiconductor layer of second conductivity type, opposite of first conductivity type, is formed in said substrate and in-between said accumulation layer and said insulator.

24. A semiconductor device comprising:

a substrate of a first conductivity type having oppositely disposed surfaces;

at least one tunnel transistor formed on said substrate, said tunnel transistor having:

(a) a semiconductor region of second conductivity type formed in said substrate near one of said oppositely disposed surfaces and an ohmic electrode formed thereon;

(b) a heavily doped region of a predetermined conductivity type formed within said semiconductor region (c) a gate formed through an insulating layer on a tunnel junction between the semiconductor region and said heavily doped region, said gate electrode not overlapping said ohmic electrode; and (d) an accumulation layer formed in said semiconductor region and beneath said gate in response to a voltage applied to said gate such that the tunnel junction is formed between said accumulation layer and said heavily doped region for a tunnel current to flow therebetween, the tunnel current being controllable in response to the predetermined voltage applied to said gate such that said tunnel current is primarily due to tunnelling effect.

25. The semiconductor device of claim 24, wherein said first and predetermined conductivity types are n type, and said second conductivity type is p type.

26. The semiconductor device of claim 24, wherein said first and predetermined conductivity types are p type, and said second conductivity type is n type.

27. The semiconductor device of claim 24, wherein said first conductivity type is p type, said second conductivity type is n type, and said heavily doped region is a silicide region forming a Schottky junction with said semiconductor region.

28. The semiconductor device of claim 24, wherein heavily doped isolation regions of first conductivity type are formed between semiconductor regions of tunnel transistors.

29. The semiconductor device of claim 24, wherein said tunnel transistor further comprises a first electrode coupled to said heavily doped region, and a second electrode coupled to said semiconductor region.

* * * * *